(12) United States Patent
Kim et al.

(10) Patent No.: US 8,974,122 B2
(45) Date of Patent: Mar. 10, 2015

(54) NANO/MICRO ROLLER BEARING HAVING TOLERANCE COMPENSATION FUNCTION AND METHOD OF MANUFACTURING THE SAME

(71) Applicant: Industry-Academic Cooperation Foundation Yonsei University, Seoul (KR)

(72) Inventors: Dae Eun Kim, Seoul (KR); Shin Sung Yoo, Seoul (KR)

(73) Assignee: Industry-Academic Cooperation Foundation Yonsei University, Seoul (KR)

(*) Notice: Subject to any disclaimer, the term of this patent is extended or adjusted under 35 U.S.C. 154(b) by 40 days.

(21) Appl. No.: 13/694,707

(22) Filed: Dec. 26, 2012

(65) Prior Publication Data

US 2014/0003746 A1  Jan. 2, 2014

(30) Foreign Application Priority Data

Jun. 27, 2012 (KR) .......................... 10-2012-0069334

(51) Int. Cl.
*F16C 33/34* (2006.01)
*B81B 7/00* (2006.01)
*B81C 1/00* (2006.01)

(52) U.S. Cl.
CPC .............. *B81B 7/00* (2013.01); *B81C 1/00531* (2013.01); *F16C 33/34* (2013.01)
USPC ....................................................... 384/567

(58) Field of Classification Search
CPC ...................................................... F16C 33/34
USPC ...................... 384/54, 56, 565, 567
See application file for complete search history.

(56) References Cited

U.S. PATENT DOCUMENTS

| | | | | |
|---|---|---|---|---|
| 975,616 | A * | 11/1910 | Hess | 384/521 |
| 3,765,071 | A * | 10/1973 | Bowen | 29/898.062 |
| 3,930,693 | A * | 1/1976 | Bowen | 384/567 |
| 4,232,914 | A * | 11/1980 | Bowen, III | 384/567 |
| 5,033,877 | A * | 7/1991 | Bowen | 384/567 |
| 5,071,265 | A * | 12/1991 | Bowen et al. | 384/567 |
| 7,032,704 | B2 * | 4/2006 | Zernickel et al. | 180/444 |
| 7,658,547 | B2 * | 2/2010 | Glueck | 384/559 |
| 8,033,738 | B2 * | 10/2011 | Nash et al. | 384/566 |
| 2006/0088236 | A1 * | 4/2006 | Hoffman | 384/553 |
| 2008/0037923 | A1 * | 2/2008 | Glueck | 384/572 |
| 2008/0112662 | A1 * | 5/2008 | Nash et al. | 384/567 |

OTHER PUBLICATIONS

Sujeet K. Sinha et al., "Application of micro-ball bearing on Si for high rolling life-cycle", Tribology International 43 (2010) pp. 178-187, 2009 Elsevier Ltd.

* cited by examiner

*Primary Examiner* — Alan B Waits
(74) *Attorney, Agent, or Firm* — LRK Patent Law Firm (57) ABSTRACT

A roller bearing having a tolerance compensation function, which is capable of being properly deformed and absorbing a processing tolerance within a range of an elastic region even when a distance between MEMS structures is changed due to the processing tolerance of the MEMS structures, being deformed to a minimum and rolled while maintaining a smooth contact with the MEMS structures by uniformly dispersing vertical loads applied from the MEMS structures through a plurality of the bearings, and thus minimizing the occurrence of abrasion and preventing damage to the bearing, and a method of manufacturing the same are provided. The roller bearing includes a roller bearing having a C-shaped section structure in which a gap having a specific interval is formed on one side of the roller bearing.

2 Claims, 12 Drawing Sheets

FIG. 1

RELATED ART

| load | VERTICAL DEFORMATION AMOUNT (nm) | MPS (GPa) | MVMS (GPa) |
|---|---|---|---|
| 20 mN (2gf) | 431 | 1.28 | 1.85 |
| 10 mN (1gf) | 216 | 0.63 | 0.924 |
| 5 mN (0.5gf) | 108 | 0.314 | 0.462 |
| 1 mN (01.gf) | 24 | 0.063 | 0.092 |
| 0.5 mN (0.05gf) | 10 | 0.031 | 0.046 |
| 0.1 mN (0.01gf) | 2 | 0.006 | 0.009 |

NANO/MICRO ROLLER BEARING HAVING TOLERANCE COMPENSATION FUNCTION AND METHOD OF MANUFACTURING THE SAME

CROSS REFERENCE TO RELATED APPLICATION

This application claims the benefit of Korean Patent Application No. 10-2012-0069334, filed Jun. 27, 2012, which is hereby incorporated by reference in its entirety into this application.

BACKGROUND OF THE INVENTION

1. Technical Field

The present invention relates to a bearing installed between two Micro Electro Mechanical System (MEMS) structures performing a relative movement and configured to perform a rolling movement and, more particularly, to a roller bearing having a tolerance compensation function, which is capable of being properly deformed and absorbing a processing tolerance within a range of an elastic region even when a distance between MEMS structures is changed due to the processing tolerance of the MEMS structures, being deformed to a minimum and rolled while maintaining a smooth contact with the MEMS structures by uniformly dispersing vertical loads applied from the MEMS structures through a plurality of the bearings, and thus minimizing the occurrence of abrasion and preventing damage to the bearing, and a method of manufacturing the same.

2. Description of the Related Art

Recently, researches into damage and abrasion phenomena in micro/nano scale have been further developed in attempts to check the origin of the abrasion phenomenon in the existing macro scale and thus have been presented as essential researches for the practical use of various micro/nano systems which are emerging worldwide.

In reality, the practicality of lots of micro systems performing a relative movement, including MEMS (Micro Electro Mechanical Systems) parts, is limited due to reliability and durability problems, and this phenomenon also appears in nano fields, such as Probe-Based Recording (PBR) technology and Scanning Probe Lithography (SPL) technology.

Since a lubricant or a bearing has not been developed to the extent that the lubricant or bearing can be successfully applied to lots of micro systems including MEMS parts of a micro/nano scale for performing a relative movement, researches into a clear examination on damage and abrasion phenomena occurring in the relative movement process of the MEMS parts of a micro/nano scale and the improvement of reliability and durability are being performed in various manners.

Meanwhile, in some researches, researches into a clear examination on a rolling phenomenon that occurs in MEMS parts performing a relative movement using a micro bearing having a diameter of several tends to several hundreds of μm are in progress. For example, in a prior art thesis issued in 'Tribology International' in 2010 (Sujeet K. Sinha, Robin Pang, Xiaosong Tang, "Application of micro-ball bearing on Si for high rolling life-cycle", Tribology International 43 (2010) 178-187), in order to solve friction and abrasion problems occurring in a relative movement between MEMS structures made of silicon, there was an attempt to obtain a very low friction coefficient of 0.005 to 0.008 by installing a borosilicate glass micro sphere having a diameter of 53±3.7 μm between the MEMS structures performing a relative movement.

However, an image of the glass micro sphere used as a micro ball bearing disclosed in the prior thesis showed that abrasion, sintering deformation, and crack phenomena were generated on a surface of the glass micro sphere. This is because the size of the glass micro spheres is not regular, a surface of the MEMS structure is not perfect flat, and there is a difference in the height of several hundreds of nm between the MEMS structures. As a result, as can be seen from a cross-sectional view of FIG. 1 that is shown in a two-dimensional manner, although several hundreds of glass micro spheres 10 are scattered between MEMS structures 20 and 30 as micro ball bearings, only some of several hundreds of the ball bearings 10 that are first scattered come in point-contact with the MEMS structures 20 and 30, but the remaining ball bearings come in contact with a surface 32 of the MEMS structure 30 on the lower side, but do not contact with a surface 22 of the MEMS structures 20 on the upper side.

Figure 1:
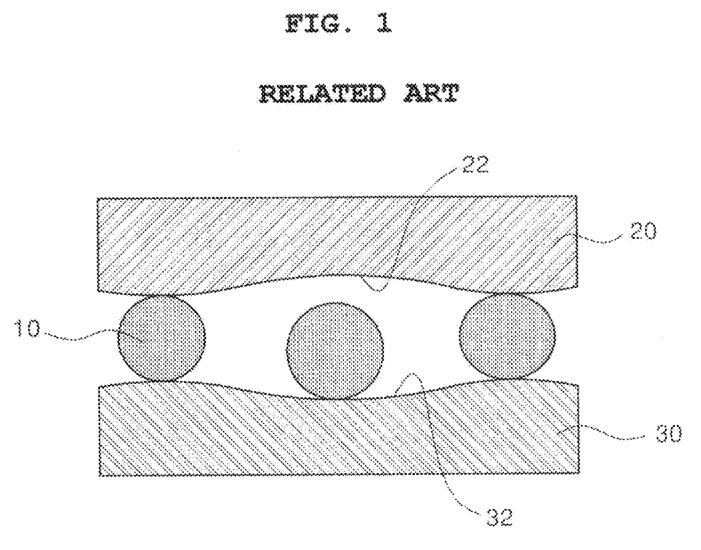
FIG. 1 is a cross-sectional view showing a state in which conventional micro ball bearings come in contact with two MEMS structures between the two MEMS structures which perform a relative movement.

In this case, a vertical load is not distributed, but is concentrated on only some of several hundreds of the ball bearings 10 because the ball bearings 10 scattered between the two MEMS structures 20 and 30 come in contact with the two MEMS structures 20 and 30 at once as described above. Accordingly, a sintering deformation is generated in some of the ball bearings on which the vertical load has been concentrated, and the ball bearing is deformed in an elliptical form not a circular form. In this case, the shape of the sintered and deformed ball is not restored to its original shape and thus a smooth rolling phenomenon is not performed. As a result, there are problems in that the ball bearing is severely abraded although the deformed ball is forcibly rolled and thus the ball bearing is broken. Furthermore, if a sintering deformation occurs only in some of the ball bearings, there are problems in that the micro balls are deformed until the number of balls capable of withstanding the vertical load comes in contact with the MEMS structures and the remaining micro balls do not function as rolling bearings properly because they do not come in contact with the surfaces of the MEMS structures.

SUMMARY OF THE INVENTION

Accordingly, the present invention has been made keeping in mind the above problems occurring in the prior art, and an object of the present invention is to provide a roller bearing having a tolerance compensation function, which is capable of being properly deformed and absorbing a mechanical processing tolerance within a range of an elastic region even when a distance between MEMS structures is changed due to the processing tolerance of the MEMS structures, being deformed to a minimum and rolled while maintaining a smooth contact with the MEMS structures by uniformly dispersing vertical loads applied from the MEMS structures through a plurality of the bearings, and thus minimizing the occurrence of abrasion and preventing damage to the bearing by forming a bearing structure having a C-shaped section structure capable of elastically deforming bearings installed between the two MEMS structures performing a relative movement, and a method of manufacturing the same.

In order to accomplish the above object, the present invention provides a roller bearing installed between two MEMS structures performing a relative movement, wherein the roller bearing is a roller bearing having a C-shaped section structure in which a gap having a specific interval is formed on one side of the roller bearing.

Here, the roller bearing may be made of silicon.

Furthermore, the internal space of the roller bearing is filled with aluminum or polymer having low stiffness.

Meanwhile, in order to accomplish the above object, an MEMS apparatus according to the present invention includes a plurality of bearings installed between two MEMS structures performing a relative movement and each configured to perform a rolling movement, wherein each of the bearings comprises a roller bearing having a C-shaped section structure in which a gap having a specific interval is formed on one side of the roller bearing.

Here, the plurality of roller bearings may be arranged in a matrix form.

Meanwhile, in order to accomplish the above object, a method of manufacturing roller bearings having a tolerance compensation function according to the present invention includes the steps of (a) coating a photoresist on a substrate having a sandwich structure in which an insulating layer is formed in a middle part thereof and patterning the photoresist so that the photoresist has a plurality of C-shaped pattern structures; (b) vertically etching the substrate up to the insulating layer placed in the middle part of the substrate using the patterned photoresists as a mask; and (c) removing the patterned photoresist on the substrate and then removing the insulating layer.

Here, a Silicon-On-Insulator (SOI) wafer in which a silicon oxide ($SiO_2$) layer, that is, the insulating layer, is formed in the middle part may be used as the substrate.

Furthermore, in the step (b), the substrate is etched using a Deep Reactive Ion Etching (DRIE) process.

Furthermore, in the step (c), the insulating layer may be removed using hydrofluoric (HF) acid.

BRIEF DESCRIPTION OF THE DRAWINGS

The patent or application file contains at least one drawing executed in color. Copies of this patent or patent application publication with color drawings will be provided by the Office upon request and payment of the necessary fee.

DESCRIPTION OF EMBODIMENTS

Some embodiments of the present invention are described in detail below with reference to the accompanying drawings.

Figure 2:
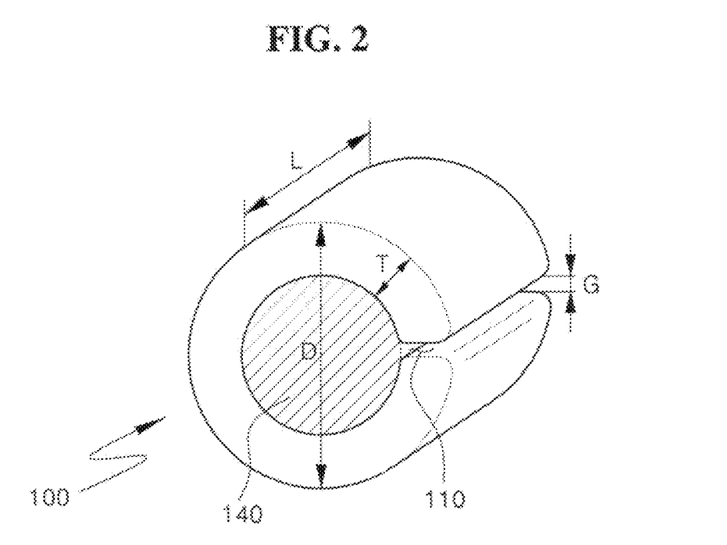
FIG. 2 is a perspective view showing the structure of a roller bearing having a tolerance compensation function in accordance with an embodiment of the present invention.

FIG. 2 is a perspective view showing the structure of a roller bearing having a tolerance compensation function in accordance with an embodiment of the present invention.

As shown in FIG. 2, a plurality of roller bearings 100 in accordance with an embodiment of the present invention is installed between two Micro Electro Mechanical System (MEMS) structures (for example, silicon wafers) performing a relative movement in MEMS and is configured to perform a rolling movement when the MEMS structures perform a relative movement. The roller bearing 100 of the present invention is configured to have a C-shaped section structure and have a hollow formed therein. A gap 110 having a specific interval G is formed on one side of the C-shaped section structure.

The roller bearing 100 is made of the same silicon material as an MEMS structure, and the lateral cross section of the roller bearing 100 has a circular shape. The roller bearing 100 may be made of materials other than the silicon material.

The roller bearing 100 is fabricated to have a micro or nano size. The roller bearing 100 can be formed to have a shape optimized for abrasion and friction by changing the outside diameter D, the length L, and the thickness T of the roller bearing 100 and the interval G of the gap 110 with consideration taken of a vertical load applied from the MEMS structures and the amount of a change in the distance between the two contact surfaces of the MEMS structures occurring due to the processing tolerance of the MEMS structures into consideration.

The roller bearing 100 constructed as above according to the present invention performs a rolling movement between two MEMS structures that performs a relative movement, while coming in contact with the two MEMS structures. In this case, the roller bearing 100 can absorb a processing tolerance through the gap 110 formed in the roller bearing 100 even when a distance between the two contact surfaces of the MEMS structures is changed due to the processing tolerance. As a result, the roller bearing 100 can continue to come in contact with the two contact surfaces of the MEMS structures and perform a rolling movement.

Figure 3:
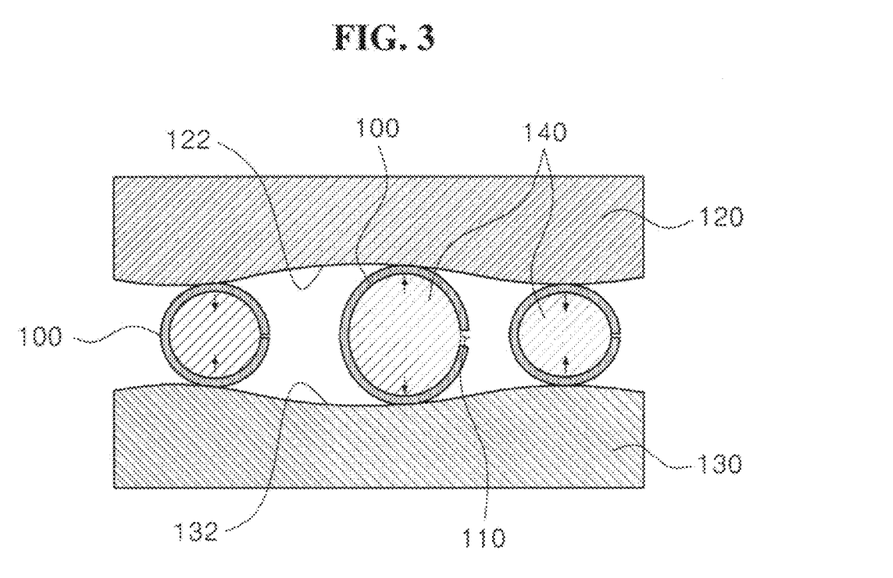
FIG. 3 is a cross-sectional view showing a state in which the roller bearings of the present invention come in contact with two MEMS structures performing a relative movement and the roller bearings are deformed between the two MEMS structures.

FIG. 3 is a cross-sectional view showing a state in which the roller bearings 100 of the present invention come in contact with two MEMS structures performing a relative movement and the roller bearings 100 are deformed between the two MEMS structures.

As shown in FIG. 3, a plurality of the roller bearings 100 of the present invention is intervened between two MEMS structures 120 and 130 performing a relative movement. The roller bearings 100 come in contact with the upper and lower contact surfaces 122 and 132 of the MEMS structures 120 and 130 and perform a rolling movement when the MEMS structures 120 and 130 perform a relative movement. Here, although a distance between the two contact surfaces 122 and 132 is changed because the contact surfaces 122 and 132 of the MEMS structures 120 and 130 on the upper and lower sides are not evenly processed due to the processing tolerance of the MEMS structures 120 and 130, elastic deformation of a specific level is generated in the roller bearing 100 by way of the gap 110 formed on one side of the roller bearing 100 and thus the roller bearing 100 can perform a rolling movement while always maintaining a contact with the two contact surfaces 122 and 132 of the MEMS structures 120 and 130.

If the roller bearing 100 is disposed between the two MEMS structures 120 and 130, the gap 110 formed in the roller bearing 100 preferably is placed at ½ of the interval G between the two contact surfaces 122 and 132 of the MEMS structures 120 and 130, that is, at the middle point of the interval G between the two contact surfaces 122 and 132 of the MEMS structures 120 and 130.

A process in which the roller bearing 100 is deformed depending on a change of the distance between the MEMS structures 120 and 130 is described below. First, in the roller bearing 100 disposed at a portion where the distance between the MEMS structures 120 and 130 is reduced, the interval G of the gap 110 of the roller bearing 100 is reduced when a great vertical load is applied to the roller bearing 100, and thus the interval G is gradually deformed from a true circular shape to an elliptical shape. This deformation of the roller bearing 100 is performed within a range of the elastic region of the roller bearing 100 made of silicon. Accordingly, the roller bearing 100 is not subject to a sintering deformation, but the roller bearing 100 can perform a normal rolling movement.

Furthermore, in the roller bearing 100 disposed at a portion where the distance between the MEMS structures 120 and 130 is widened, relatively small elastic deformation is generated in the roller bearing 100 because a vertical load due to the MEMS structures 120 and 130 is less applied. Accordingly, the roller bearing 100 comes in contact with the two contact surfaces 122 and 132 of the MEMS structures 120 and 130 at the same time and performs a normal rolling movement in the state in which the roller bearing 100 maintains its true circular sectional shape.

As described above, although a distance between the two contact surfaces 122 and 132 is changed because the contact surfaces 122 and 132 of the MEMS structures 120 and 130 coming in contact with the roller bearing 100 are not evenly processed due to a processing tolerance, the roller bearing 100 can absorb the tolerance because it is deformed within its elastic range according to the distance between the two contact surfaces 122 and 132. Accordingly, the deformation of the roller bearing 100 can be minimized because the vertical load is uniformly distributed over a plurality of the roller bearings 100 interposed between the MEMS structures 120 and 130.

Figure 4:
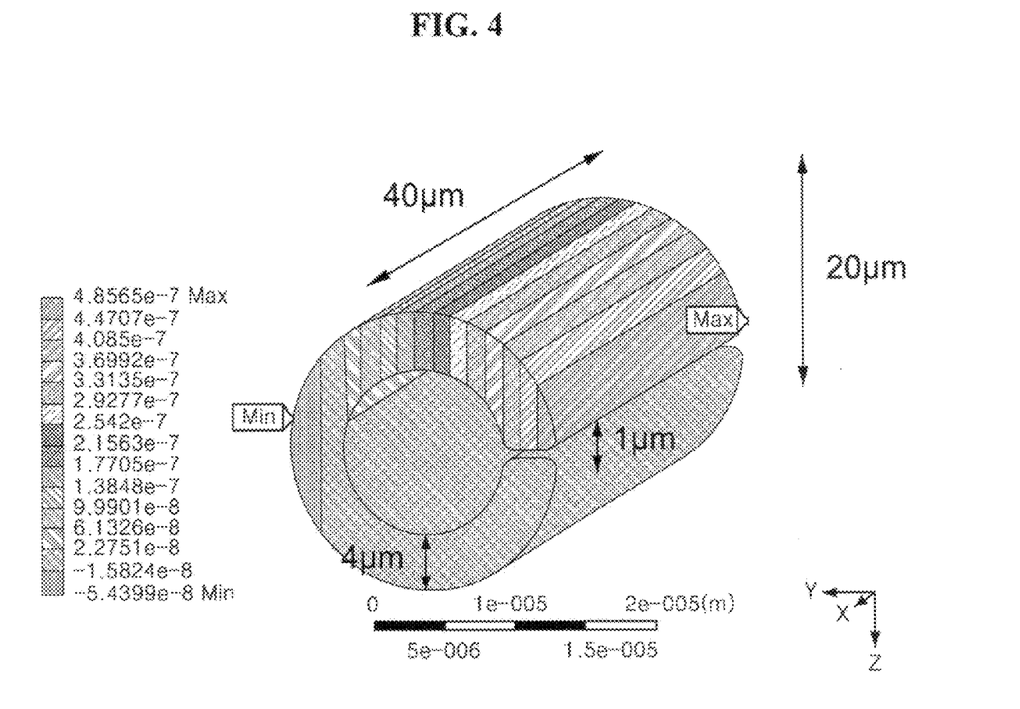
FIG. 4 is a simulation diagram showing a distribution of vertical deformation amounts in the center-Z-axis direction of the roller bearing according to the present invention when a vertical load of 1 gf is applied to the roller bearing.
Figure 5:
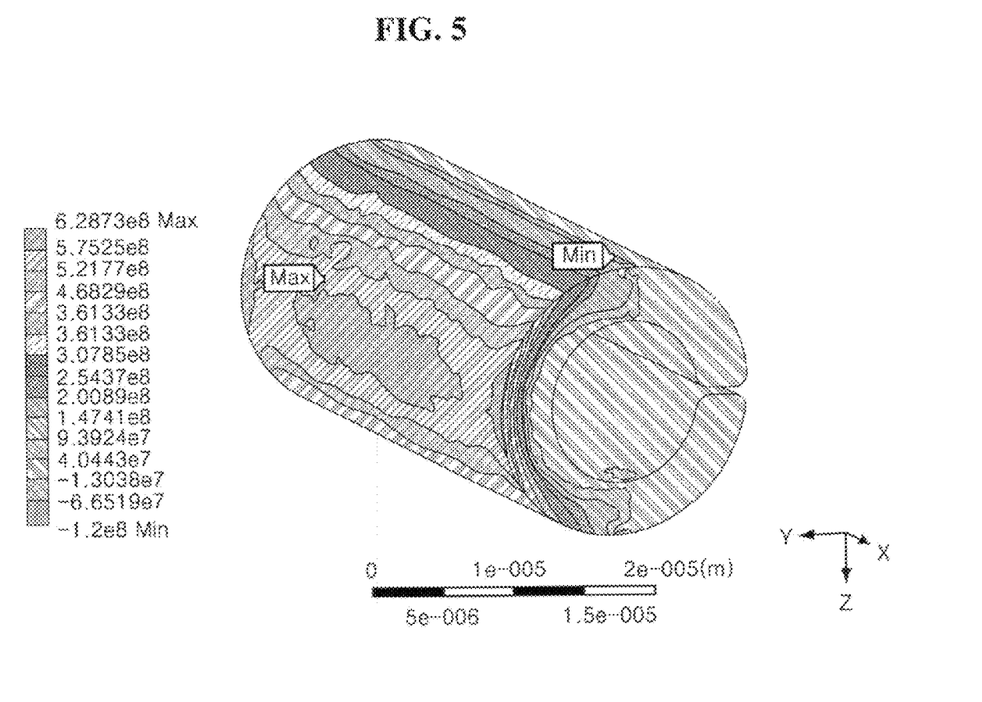
FIG. 5 is a simulation diagram showing a Maximum Principal Stress (MPS) distribution of the roller bearing according to the present invention when a vertical load of 1 gf is applied to the roller bearing.
Figure 6:
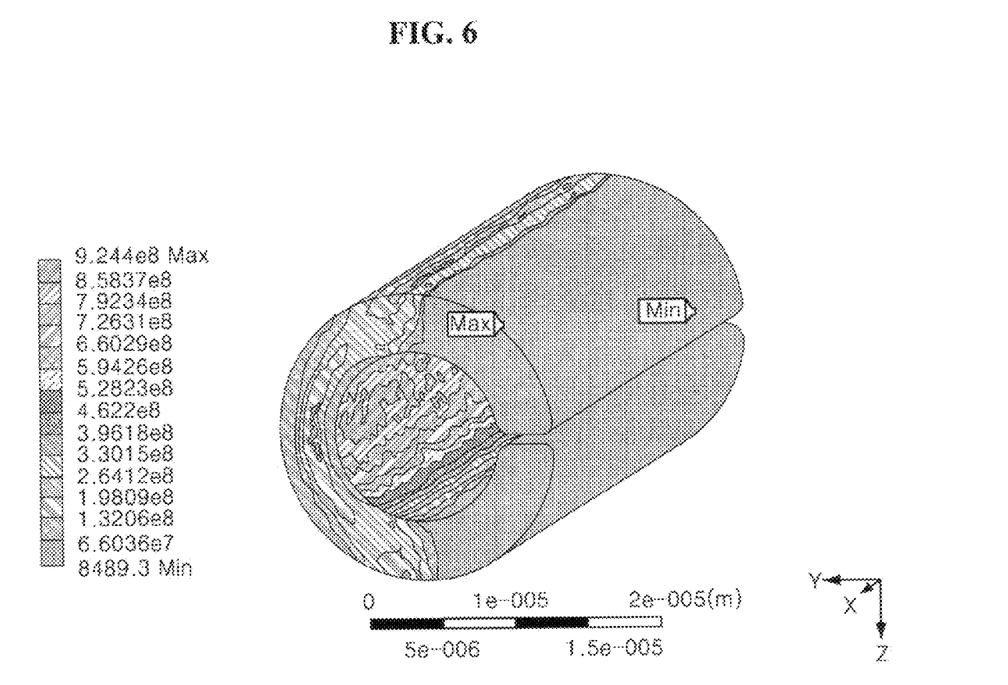
FIG. 6 is a simulation diagram showing the Von Mises Stress (VMS) distribution of the roller bearing according to the present invention when a vertical load of 1 gf is applied to the roller bearing.

FIG. 4 shows the results of analyses into a vertical deformation amount, occurring when a vertical load of 1 gf is applied to the roller bearing 100 of the present invention, through FEM. Furthermore, FIG. 5 shows a Maximum Principal Stress (MPS) distribution when a vertical load of 1 gf is applied to the roller bearing 100, and FIG. 6 shows a Von Mises Stress (VMS) distribution when a vertical load of 1 gf is applied to the roller bearing 100. The experiments using the FEM were performed on the roller bearing 100 having the outside diameter D of 20 μm, the length L of 40 μm, the thickness T of 4 μm, and the gap interval G of 1 μm.

From FIG. 4, it can be seen that when a vertical load of 1 gf was applied to the roller bearing 100 of the present invention, the vertical deformation amount was gradually increased from the top of the roller bearing 100 to a side part where the gap 110 was placed. Here, it can be seen that a maximum vertical deformation amount (i.e., a vertical deformation amount in a center-z-axis direction) of about 216 nm was generated in relation to the vertical load of 1 gf. Furthermore, from FIGS. 5 and 6, it can be seen that when a vertical load of 1 gf was applied to the roller bearing 100 of the present invention, a high stress distribution appeared in a portion opposite to the gap and maximum stresses of about 0.63 GPa and 0.93 GPa were generated in relation to the vertical load of 1 gf.

Figure 7:
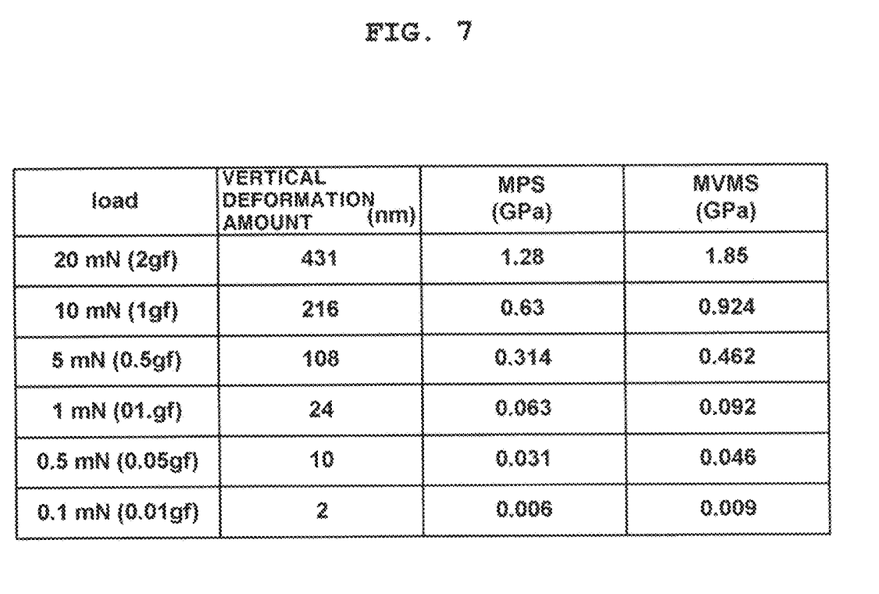
FIG. 7 is a table showing experimental data for the vertical deformation amount and maximum stress of the roller bearing according to the present invention to a variety of vertical loads applied to the roller bearing.

FIG. 7 is a table showing data regarding vertical deformation amounts and maximum stresses that were measured when a variety of vertical loads were applied to the roller bearing 100 according to the present invention. Furthermore, FIG. 8 is a graph showing a relationship between the vertical deformation amounts and the vertical loads applied to the roller bearing 100 based on the data shown in the table of FIG. 7.

From among items shown in the table, an item 'MPS' denotes a Maximum Principal Stress and an item 'MVMS' denotes a Maximum Von Mises Stress.

Figure 8:
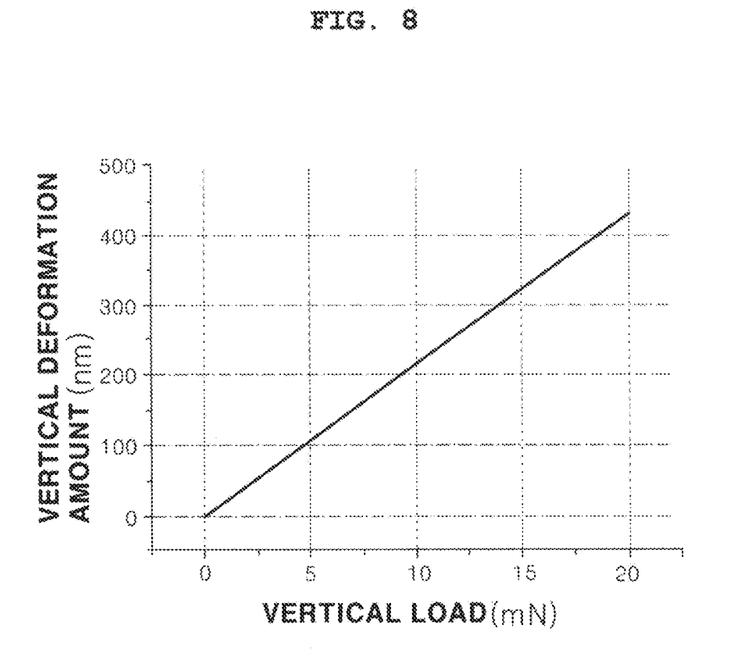
FIG. 8 is a graph showing a relationship between vertical deformation amounts and vertical loads applied to the roller bearing of the present invention.

From the graph of FIG. 8, it can be seen that the relationship between the vertical deformation amounts and the vertical loads applied to the roller bearing 100 of the present invention has a linear relationship. Accordingly, the roller bearing 100 can be designed to have a shape optimized for friction and abrasion by determining the outside diameter D, the length L, and the thickness T of the roller bearing 100 and the interval G of the gap 110 with consideration taken of a vertical load applied to the roller bearing 100 and a change of the distance between the two contact surfaces 122 and 132 of the MEMS structures 120 and 130 that perform a relative movement.

Furthermore, when the MEMS structures apply a vertical load of 1 gf, if 10 roller bearings 100 having the above vertical deformation amount and stress distribution characteristics are used, the load is distributed over the 10 roller bearings 100. Here, a vertical deformation amount occurring in each of the roller bearings 100 is reduced due to the distribution of the load. Here, the degree of the true circle of the roller bearing 100 is about 0.0012, which has a circular shape that is rarely deformed, and the MPS is about 0.63 GPa, which falls within a range of an elastic region of about 7 GPa, that is, the maximum main stress of the silicon roller bearing.

As described above, since the vertical load applied from the MEMS structures 120 and 130 is uniformly distributed over the 10 roller bearings 100, deformation or abrasion is rarely generated in the roller bearing 100 and the section of the roller bearing 100 has almost a circular shape. As a result, a rolling phenomenon can be smoothly performed, and thus the roller bearing 100 can maintain a very low friction coefficient.

Figure 9:
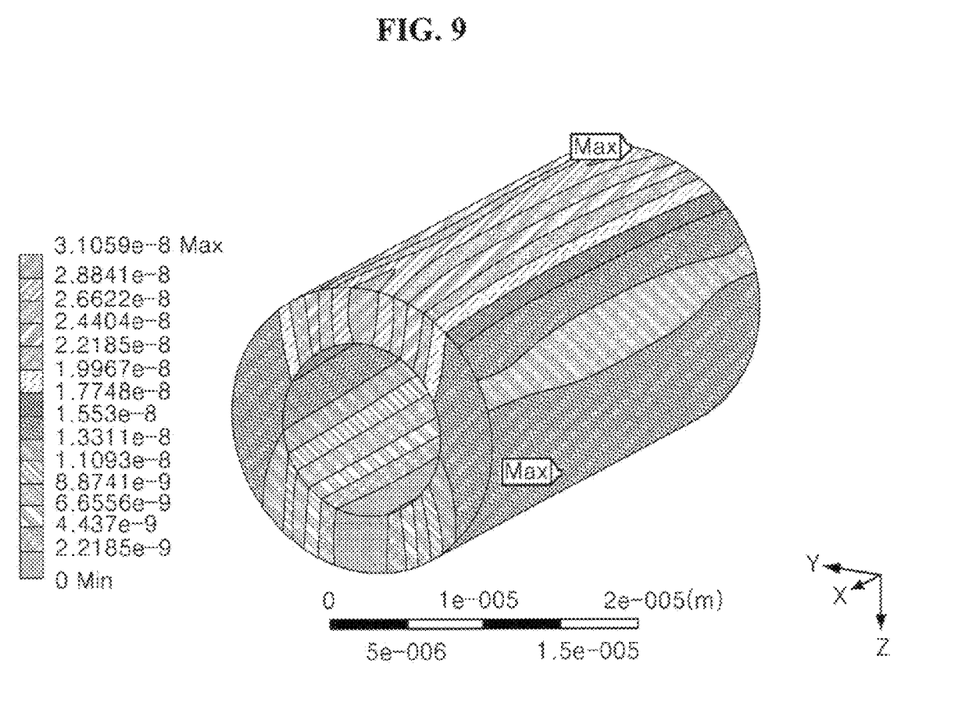
FIG. 9 is a simulation diagram showing a distribution of vertical deformation amounts when a vertical load of 1 gf is applied to a roller bearing without a gap.
Figure 10:
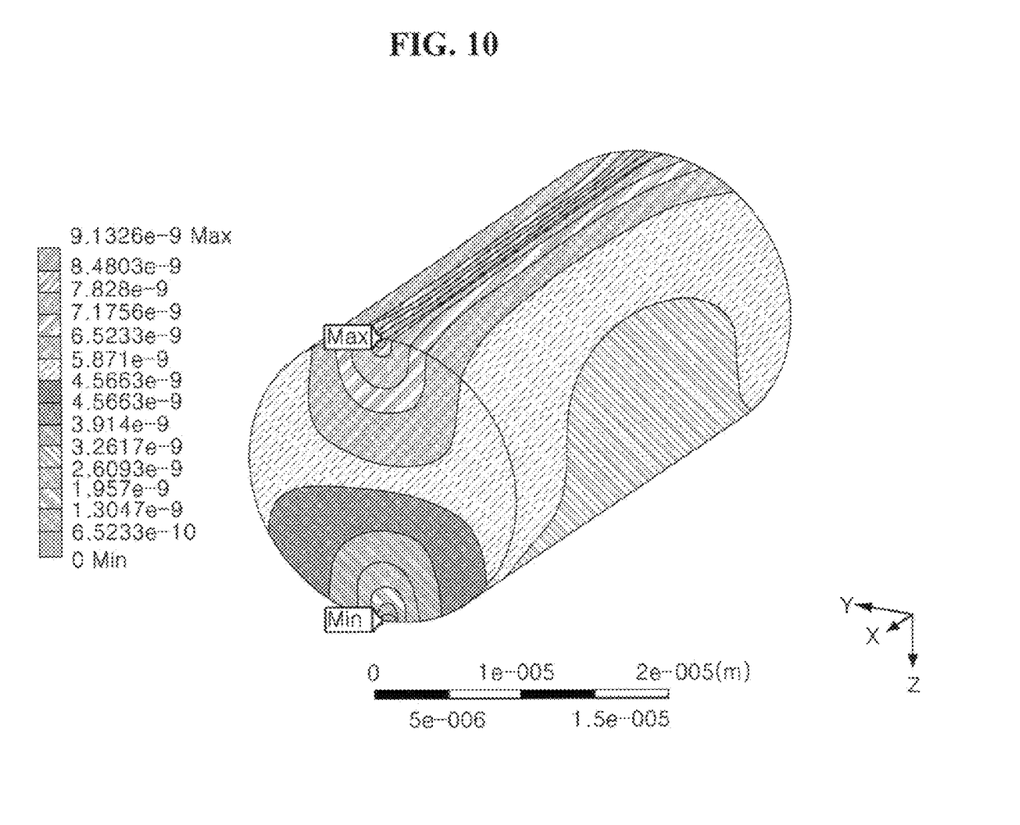
FIG. 10 is a simulation diagram showing a distribution of vertical deformation amounts when a vertical load of 1 gf is applied to a roller bearing configured to have the inside filled without a gap.

Meanwhile, FIGS. 9 and 10 show the results of measured vertical deformation amounts of roller bearings having different shapes from that of the aforementioned embodiment of the present invention. FIG. 9 shows vertical deformation amounts generated when a vertical load of 1 gf was applied to a roller bearing without a gap, and FIG. 10 shows vertical deformation amounts when a vertical load of 1 gf was applied to a cylindrical roller bearing.

From the analysis results of the FEM of FIG. 9, it can be seen that a vertical deformation amount of about 31 nm was generated when a vertical load of 1 gf was applied to the roller bearing without a gap. From the fact that the vertical deformation amount of about 216 nm was generated when a vertical load of 1 gf was applied to the roller bearing structure of the present invention having the gap, it can be seen that the stiffness of the roller bearing without a gap is about 7 times greater than the stiffness of the roller bearing with the gap.

Furthermore, as shown in the results of FIG. 10, it can be seen that a vertical deformation amount of about 9 nm was generated when a vertical load of 1 gf was applied to the roller bearing without a gap and not having a tube shape. From the fact that the vertical deformation amount of about 216 nm was generated when a vertical load of 1 gf was applied to the roller bearing 100 of the present invention with the gap, it can be seen that the stiffness of the cylindrical roller bearing structure without a gap and not having a tube shape is about 24 times greater than that of the roller bearing 100 of the present invention with the gap.

Figure 11:
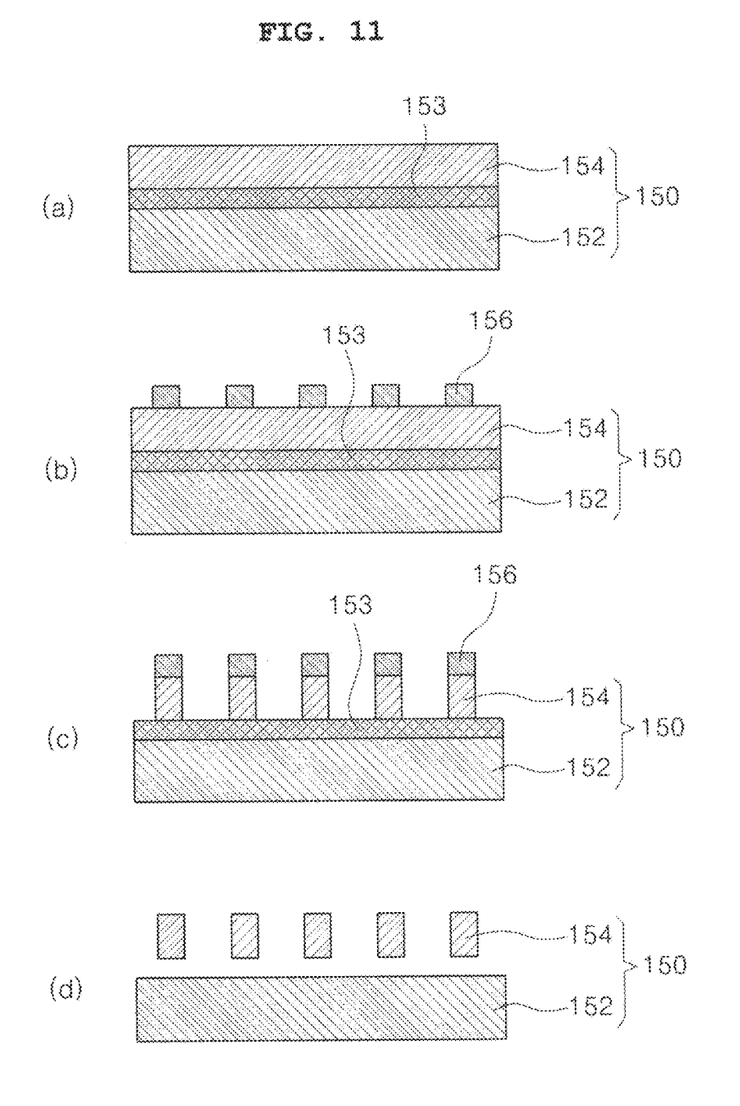
FIG. 11 is a process diagram showing a method of manufacturing a roller bearing having a tolerance compensation function in accordance with an embodiment of the present invention.

Meanwhile, FIG. 11 is a process diagram showing a method of manufacturing the roller bearing 100 configured to have the shape of FIG. 2 and to have a tolerance compensation function in accordance with an embodiment of the present invention. Furthermore, FIG. 12 is a plan view of a mask design for roller bearings which is used in the process of manufacturing roller bearings 100 of FIG. 11.

Referring to FIGS. 11 and 12, in the method of manufacturing the roller bearing 100 having a tolerance compensation function according to the present invention, as shown in FIG. 11(a), a substrate 150 having a sandwich structure in which an insulating layer 153 is formed in the middle part of the sandwich substrate is prepared. The substrate 150 has a structure in which a lower substrate 152, the insulating layer 153, and an upper substrate 154 are sequentially stacked. A Silicon-On-Insulator (SOI) wafer in which a silicon oxide (SiO$_2$) layer is formed in the middle part of the SOI wafer can be used as the substrate 150.

Figure 12:
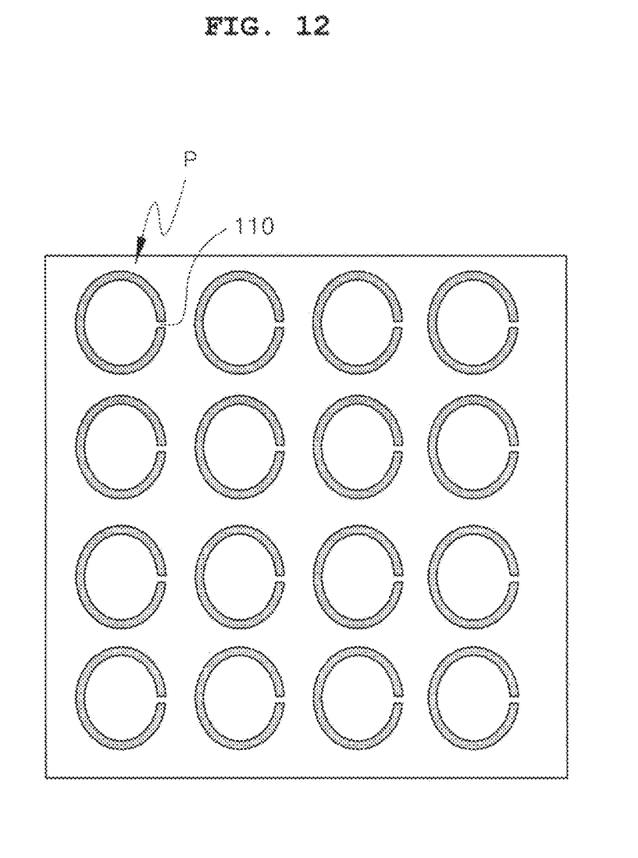
FIG. 12 is a plan view of a mask design for roller bearings which is used in the process of manufacturing roller bearings of FIG. 11.

When the substrate 150 having the insulating layer 153 formed in the middle part is prepared as described above, photoresists 156 are coated on the upper substrate 154 and each of the photoresists 156 is patterned in a C-shaped pattern P having the gap 110 formed on one side like a mask design shown in FIG. 12, as shown in FIG. 11(b).

Thereafter, as shown in FIG. 11(c), the upper substrate 154 is vertically etched up to the top of the insulating layer 153 placed in the middle part of the substrate 150 by way of a Deep Reactive Ion Etching (DRIE) process using the patterned photoresists 156 as a mask.

Next, as shown in FIG. 11(d), after removing the patterned photoresists 156 on the substrate 154, a plurality of the roller bearings 100 each having a C-shaped section and a tolerance compensation function can be fabricated by selectively removing the insulating layer 153 of the silicon oxide layer using Hydrofluoric (HF) acid.

Figure 13:
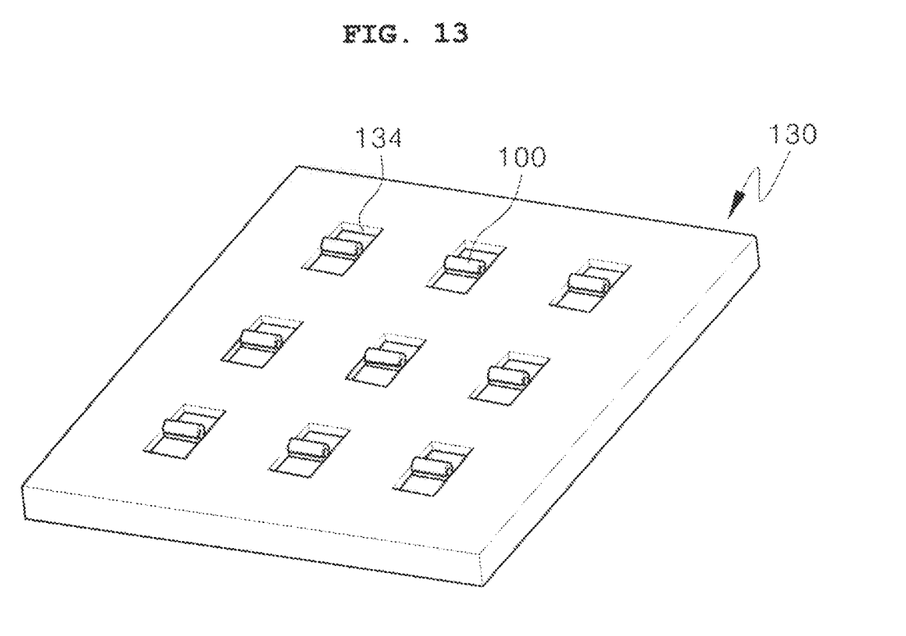
FIG. 13 is an exemplary diagram showing a structure in which roller bearings having a tolerance compensation function are arranged on a silicon substrate in a matrix form according to the present invention.

Meanwhile, FIG. 13 shows a state in which a plurality of the roller bearings 100 having a tolerance compensation function fabricated by the aforementioned manufacturing method is arranged on the MEMS structures 130 of an MEMS apparatus which perform a relative movement. In FIG. 13, only one MEMS structure placed on the lower side, from among the two MEMS structures performing a relative movement, is shown.

As shown in FIG. 13, a plurality of grooves 134 each having a rectangular shape is arranged in a matrix form in one MEMS structure 130 made of silicon. The plurality of roller bearings 100 can be installed in the respective grooves 134 by way of the aforementioned method. Although not shown, an upper-side MEMS structure is placed on the lower-side MEMS structure 130 in which the roller bearings 100 are installed so that the two MEMS structure perform a straight-line reciprocation.

Meanwhile, in the embodiment of the present invention, the structure in which the inside of the roller bearing 100 is filled with air has been illustrated as an example. For example, a roller bearing whose internal space is filled with soft material having relatively low stiffness instead of air may be used in addition to the roller bearing structure. Here, aluminum or polymer 140 can be used as the soft material that can be buried in the inside of the roller bearing.

As described above, in accordance with the present invention, a vertical load applied from the MEMS structures performing a relative movement is uniformly distributed over the plurality of roller bearings 100 having low stiffness. Accordingly, the roller bearing 100 can be prevented from being damaged by sintering deformation because the roller bearing 100 is deformed within a range of an elastic region to the highest degree. Furthermore, the abrasion of the roller bearing 100 can be minimized because the roller bearing 100 has a low friction coefficient between the two contact surfaces 122 and 132 of the MEMS structures 120 and 130 performing a relative movement and perform a rolling movement.

Furthermore, there is an advantage in that the nano/micro roller bearing 100 having a diameter of several hundreds of nano meters to several tends of micro meters can be mass-produced using the aforementioned MEMS manufacturing process.

In accordance with the present invention, each of the bearings installed between two MEMS structures performing a relative movement is formed to have the bearing structure having the C-shaped section structure that can be elastically deformed. Accordingly, although a distance between the MEMS structures is changed due to the processing tolerance of the MEMS structures, the roller bearing is properly deformed within a range of an elastic region, thus being capable of effectively absorbing the mechanical processing tolerance of the MEMS structures. Furthermore, since a vertical load applied from the MEMS structures can be uniformly distributed over the plurality of roller bearings, the deformation of the roller bearings can be minimized, and the roller bearings can perform a rolling movement while maintaining a smooth contact with the MEMS structures. As a result, the abrasion of a surface of the roller bearing can be minimized, and damage to the bearing can be prevented.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A roller bearing installed between two Micro Electro Mechanical System (MEMS) structures performing a relative movement and configured to have a tolerance compensation function, the roller bearing comprising:
    a roller bearing made of silicon and having a C-shaped section structure in which a gap having a specific interval is formed on one side of the roller bearing,
    wherein an internal space of the roller bearing is filled with aluminum or polymer.

2. A Micro Electro Mechanical System (MEMS) apparatus comprising a plurality of bearings installed between two MEMS structures performing a relative movement and each bearing configured to have a tolerance compensation function and perform a rolling movement, wherein each of the bearings comprises a roller bearing made of silicon and having a C-shaped section structure in which a gap having a specific interval is formed on one side of the roller bearing, wherein an internal space of the roller bearing is filled with aluminum or polymer and the plurality of roller bearings is arranged in a matrix form.

* * * * *